United States Patent [19]
Maa et al.

[11] Patent Number: 5,989,965
[45] Date of Patent: Nov. 23, 1999

[54] NITRIDE OVERHANG STRUCTURES FOR THE SILICIDATION OF TRANSISTOR ELECTRODES WITH SHALLOW JUNCTION

[75] Inventors: Jer-Shen Maa, Vancouver; Sheng Teng Hsu, Camas; Chien-Hsiung Peng, Vancouver, all of Wash.

[73] Assignees: Sharp Laboratories of America, Inc., Camas, Wash.; Sharp Kabushiki Kaisha, Osaka, Japan

[21] Appl. No.: 09/023,032

[22] Filed: Feb. 13, 1998

[51] Int. Cl.$^6$ ........................................... H01L 21/336
[52] U.S. Cl. .................... 438/303; 438/305; 438/586
[58] Field of Search .................. 438/301, 303, 438/305, 586, 689

[56] References Cited

U.S. PATENT DOCUMENTS

| | | | |
|---|---|---|---|
| 5,451,532 | 9/1995 | Bashir et al. | 437/41 |
| 5,620,919 | 4/1997 | Godinho et al. | 438/220 |
| 5,691,212 | 11/1997 | Tsai et al. | 437/24 |
| 5,744,395 | 4/1998 | Shue et al. | 438/305 |
| 5,766,991 | 6/1998 | Chen | 438/231 |
| 5,776,822 | 7/1998 | Fuji et al. | 438/586 |
| 5,783,475 | 7/1998 | Ramaswami | 438/303 |

OTHER PUBLICATIONS

Paper titled, "Edge Leakage of Cobalt Silicided Shallow Junctions" by C.H. Peng, J.S. Maa and S.T. Hsu, published in 1997 Elsevier Sciences S.A., Thin Solid Films 308–309, pp. 575–579.

Paper entitled, "Low–Temperature Processing of Shallow Junctions Using Epitaxial and Polycrystalline CoSi$_2$," by E.C. Jones, N.W. Cheung, and D.B. Fraser, published in the Journal of Electronic Materials, vol. 24, No. 7, 1995, pp. 863–873.

Article entitled, "A Study of the Leakage Mechanisms of Silicided n$^+$/p Junctions" by R. Liu, D.S. Williams, and W.T. Lynch, published in J. Appl. Phys. 63(6) Mar. 15, 1988, pp. 1990–1999.

Article entitled, "Effect of Argon ION Bombardment on the Stability on the Stability of Narrow Cobalt Silicide/Polysilicon Structure", by Jer–shen Maa and Chien–Hsiung Peng, published in Mat. Res. Soc. Symp. Proc. vol. 438, 1997 Materials Research Society, pp. 301–307.

*Primary Examiner*—John F. Niebling
*Assistant Examiner*—Michael Lebentritt
*Attorney, Agent, or Firm*—David C. Ripma

[57] ABSTRACT

A method of forming a temporary overhang structure to shield the source/drain edges near the gate electrode from the deposition of silicidation metal is provided. The growth of silicide on the source/drain regions remains controlled, without the presence of silicidation metal on the gate electrode sidewalls near the source/drain edges. The resulting silicide layer does not have edge growths interfering with the source/drain junction areas. The overhang structure is formed by covering the gate electrode with two insulators having differing etch selectivities. The top insulator is anisotropically etched so that only the top insulator covering the gate electrode vertical sidewalls remains. The exposed bottom insulator is isotropically etched to form a gap between the top insulator and the source/drain region surfaces. When silicidation metal is deposited, the gap prevents the deposition of metal between the gate electrode and the source/drain region surfaces. A transistor, with an overhang structure, fabricated by the above-mentioned procedure is also provided.

16 Claims, 10 Drawing Sheets

*(PRIOT ART)*

*(PRIOT ART)*

*(PRIOT ART)*

*(PRIOT ART)*

*(PRIOT ART)*

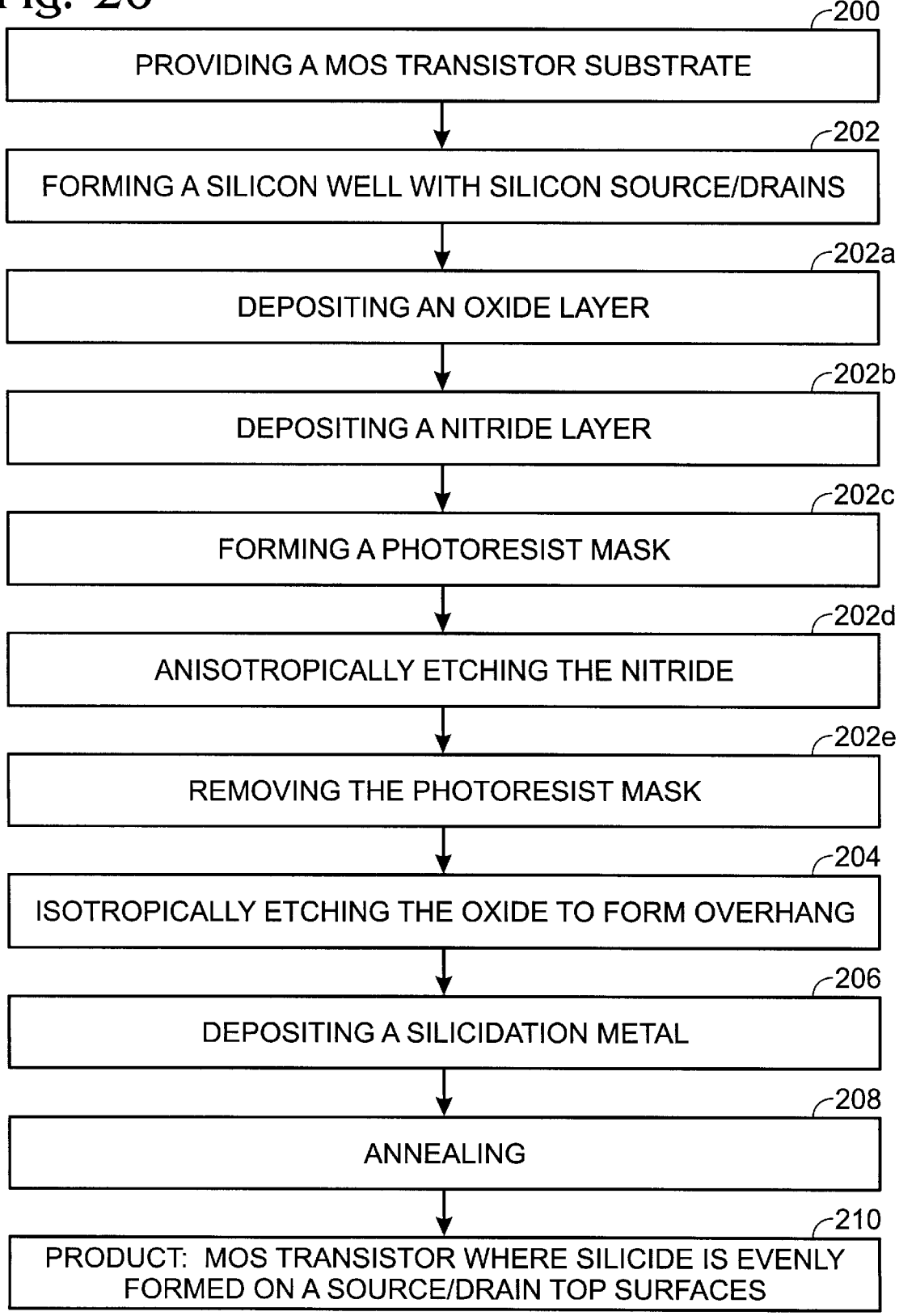

NITRIDE OVERHANG STRUCTURES FOR THE SILICIDATION OF TRANSISTOR ELECTRODES WITH SHALLOW JUNCTION

BACKGROUND AND SUMMARY OF THE INVENTION

This invention relates generally to semiconductor technology and more particularly to the formation of silicided electrodes in active semiconductor devices, such as MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source/drain/gate electrodes, and the channel region of each device, decrease correspondingly.

The design of ever smaller planar transistors with short channel lengths makes it necessary to provide very shallow source/drain junction regions. Shallow junctions are necessary to avoid lateral diffusion of implantation dopants into the channel, such diffusion being undesirable because it contributes to leakage currents and poor breakdown performance. Shallow source/drain junction regions, for example, less than 1000 angstroms (Å) thick, and preferably less than 500 Å thick, are necessary for acceptable performance in short channel devices.

When shallow junction electrodes are used in transistors, it becomes more difficult to provide reliable, low resistance connections to the source/drain regions of the device. Metal-silicide contacts are a typical means of effecting such connections to source/drain/gate electrodes. In such contacts, conductive metal is deposited on the silicon electrodes and annealed to form a metal-silicon compound on the surface of the electrodes. The compound, called silicide, is electrically and physically bonded to the electrode, and has a substantially lower sheet resistance than the doped silicon on which it is formed. An important advantage of silicide contacts in small devices is that suicide is only formed where the deposited metal is in contact with silicon. By means of a selective etch the metal is readily removed from the non-silicided areas. Thus, the silicide regions are automatically aligned on the electrode surfaces only. This self-aligned silicide process is generally referred to as the "salicide" process.

One difficulty presented by the salicide process on shallow junction source and drain regions is that it consumes a portion of the surface silicon. The metal-silicide is formed from a chemical reaction which occurs during an annealing step, when the deposited metal reacts with the underlying silicon. Electrodes with very thin junction depths have less silicon to sacrifice to the formation of silicide, and can only permit a very thin layer of silicide to be formed. Thin silicide films are known to be thermally unstable and have an undesirably high sheet resistance.

One prior art technique for increasing the thickness of the silicide contacts is to deposit additional silicon on the surface of the source and drain regions. The additional silicon in the raised source and drain electrodes can then be used in the reaction with deposited metal to form thicker silicide layers. This solution has disadvantages because the deposition of additional silicon produces additional diffusion of dopants and additional process steps which increase fabrication costs.

It is a well observed fact that inconsistent junction leakage currents often result from the salicidation of source/drain electrodes. It is believed that the random leakage phenomena is the result of silicide edges. The formation of "excess" suicide, into the source/drain areas around the edges of the source/drain electrodes, and in close proximity to the junction areas underlying the source/drain electrodes, leads to the leakage current problem. These incursions, perturbations, or greater thicknesses of silicide cause large electric field variances, and may even permit electrical conductivity extending through the junctions. While the amount of silicide formed on the main body of the source/drain electrodes is controlled by the thickness of the deposited silicidation metal, additional supplies of the metal are available around the edges of the source/drain electrodes where the metal is deposited on non-reacting surfaces, such as oxides.

A co-pending patent application entitled PARTIAL SILICIDATION METHOD TO FORM SHALLOW SOURCE/DRAIN ELECTRODES, invented by Maa et al., filed on Feb. 13, 1998, and assigned to the same assignees as the instant patent application, presents one solution to the problem of silicided edges. In the above-mentioned application, the silicide layer on the source/drain electrodes is formed in a two-step anneal process. A low temperature anneal begins the silicidation process. Then, the unreacted silicidation metal is removed and a higher temperature anneal finishes the process. Removing the unreacted metal between annealings prevents the formation of excessive silicide around the edges of the source/drain electrodes. However, multiple annealing steps are not convenient for all processes.

Accordingly, a method for forming shallow source/drain junctions with low leakage currents in a MOS transistor is provided. The method comprises the steps of:

a) forming source/drain regions, having a horizontal top surface and edges around the perimeter of the top surface bounded by field oxide regions in a silicon well, and forming a gate electrode with vertical sidewalls adjacent the top surface;

b) selectively forming nitride overhang structures on the field region adjoining the source/drain top surfaces and the vertical sidewalls of the gate electrode, creating a gap between nitride structures and the edges of the top surfaces, whereby the perimeter of the top surfaces is located in the gap;

c) depositing metal overlying the top surfaces, gate electrode, and field oxide in a thin enough layer so as to form gaps between the nitride structures and the source/drain top surfaces, isolating the metal overlying the top surfaces from the metal overlying the field oxide and the gate electrode; and d) annealing the metal at a first temperature and first time duration, forming a layer of low resistance silicide compound having a predetermined nominal silicide layer thickness and a predetermined silicide thickness tolerance, whereby silicide is formed on the source/drain top surfaces, but not the insulating surfaces adjoining the source and drain.

The nitride overhang structure is created by the following method:

$a_1$) depositing a thin layer of oxide overlying the gate electrode, source/drain regions, and field oxide regions;

$a_2$) depositing a nitride layer overlying the oxide layer deposited in Step $a_1$;

$a_3$) forming a photoresist mask selectively overlying the field oxide regions, exposing the nitride layer overlying the source/drain top surfaces and gate electrode, whereby the field oxide is protected;

a$_4$) anisotropically etching, in the vertical direction, the nitride layer, removing the nitride layer overlying the source/drain top surface and exposing the oxide layer deposited in Step a$_1$), but not etching the nitride overlying the vertical sidewalls of the gate electrode;

a$_5$) etching to remove the photoresist overlying the field oxide region. Then, Step b) includes isotropically etching with an etchant having a higher oxide to nitride etch selectivity, removing the oxide layer overlying the source/drain regions, to form the nitride overhang structures.

The source/drain junction areas are completely formed either before, or after the silicidation process. One aspect of the invention includes a further step, following Step a), and preceding Step a$_1$), of:

a$_6$) implanting the source/drain regions with dopant and annealing, forming source/drain junction areas with metallurgical edges at a junction depth in the range between 300 and 2000 Å from the source/drain top surfaces. Alternately, a further step, follows Step d), of:

e) implanting the source/drain regions with dopant and annealing, forming source/drain junction areas with metallurgical edges at a junction depth of between 300 and 2000 Å.

A MOS transistor, and process to make a transistor having shallow source/drain junctions with low leakage current are also provided. The transistor comprises silicon source/drain regions having horizontal top surfaces, and edges around the perimeter of said top surfaces. The transistor also comprises field oxide regions with boundaries adjacent at least part of the top surface perimeter. Source/drain junction areas exist with metallurgical edges at a predetermined junction depth from the respective source/drain top surfaces. A gate electrode having vertical sidewalls is located adjacent the source/drain regions. Nitride overhang structures temporarily overlie the gate electrode vertical sidewalls and field oxide boundaries, adjoining the source/drain top surfaces. The nitride overhang structures have a first gap between the overhang structures and the source/drain top surfaces. Finally, a low resistance silicide layers overlies the source/drain top surfaces. The sulicide layers have a predetermined nominal silicide layer thickness and a predetermined silicide thickness tolerance, whereby the spacing between the junction area and said silicide layer is maximized by preventing silicide perturbations on said silicon top surfaces. The nitride structures and silicide layers are formed per the above-described method. After silicidation, the nitride structures can be removed.

BRIEF DESCRIPTION OF THE DRAWINGS

FIG. 20 is a flow chart illustrating a method for forming shallow source/drain junctions with low leakage currents.

DETAILED DESCRIPTION OF THE PREFERRED EMBODIMENT

Figure 1:
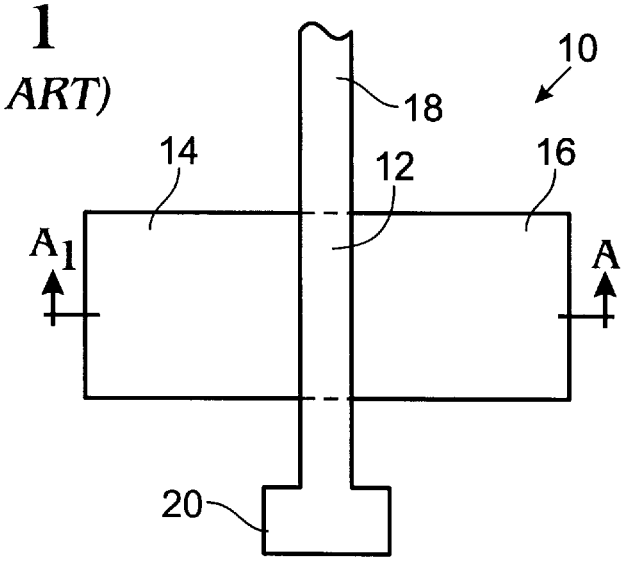
FIGS. 1–5 illustrate the formation of silicided source/drain electrodes (prior art).

FIGS. 1–5 are steps in the fabrication of a completed MOS transistor with silicided source/drain electrodes (prior art). FIG. 1 is a plan view of a MOS transistor 10 (prior art). Transistor 10 is formed on a silicon substrate and comprises a gate electrode 12 overlying a source region 14 and a drain region 16. Transistor 10 is typically part of an integrated circuit with connections on the same level through interconnection 18, and connections to other levels (not shown) through interconnection 20.

Figure 2:
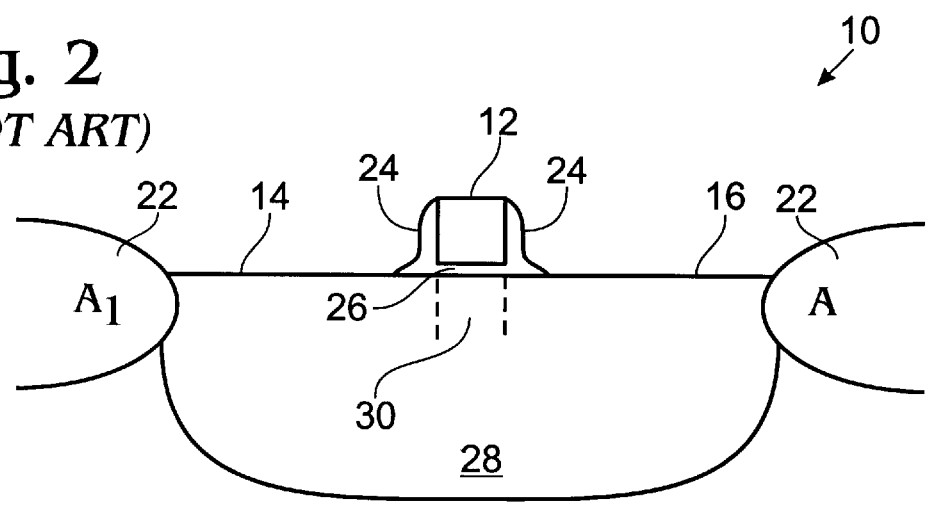

FIG. 2 is a partial cross-sectional view of transistor 10 of FIG. 1 (prior art). Transistor 10 is isolated from neighboring transistors with regions of field oxide 22. Associated with gate electrode 12 are vertical insulating gate sidewalls 24 and a gate oxide layer 26 underlying gate electrode 12. Gate 12 has been formed overlying a well of silicon 28 previously implanted with dopant. Channel area 30 is approximately defined between the broken lines underlying gate oxide layer 26.

Figure 3:
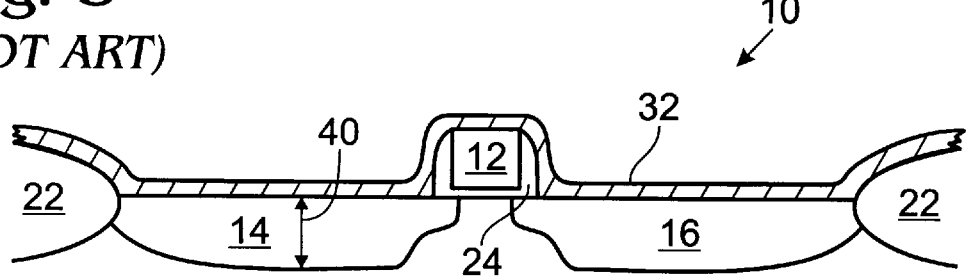

FIG. 3 is a partial cross-sectional view of transistor 10 of FIG. 2 after the deposition of a silicidation metal 32 (prior art). Metal layer 32 has been deposited overlying source 14, drain 16, gate electrode 12, sidewalls 24, and field oxide regions 22.

Figure 4:
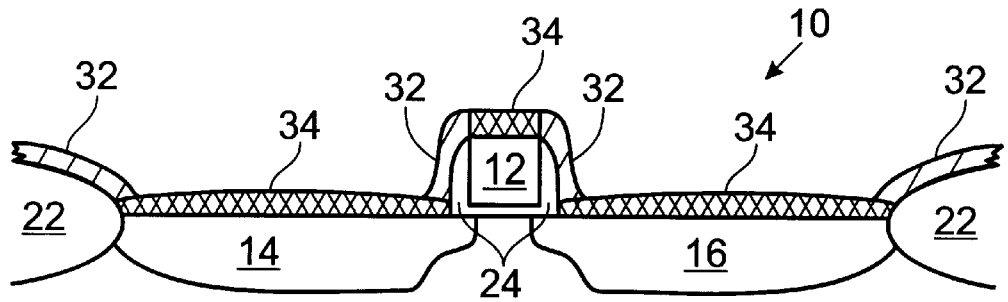

FIG. 4 is a partial cross-sectional view of transistor 10 of FIG. 3 during the silicidation of source/drain electrodes 14/16 (prior art). Transistor 10 is being annealed, reacting metal 32 to silicon, to form a layer of silicide 34 overlying source/drain 14/16. Silicide layer 34 is often formed overlying gate electrode 12 in the same process. Typically, to transistor 10 is annealed until all metal 32 (FIG. 3) overlying source/drain 14/16 is consumed, and silicide layer 34 forms. However, the exact timing of this process is difficult to determine. A longer annealing time causes unreacted metal 32, adjoining source/drain 14/16 on oxide sidewalls 24 and field oxide regions 22, to continue the silicidation of the silicon.

Figure 5:
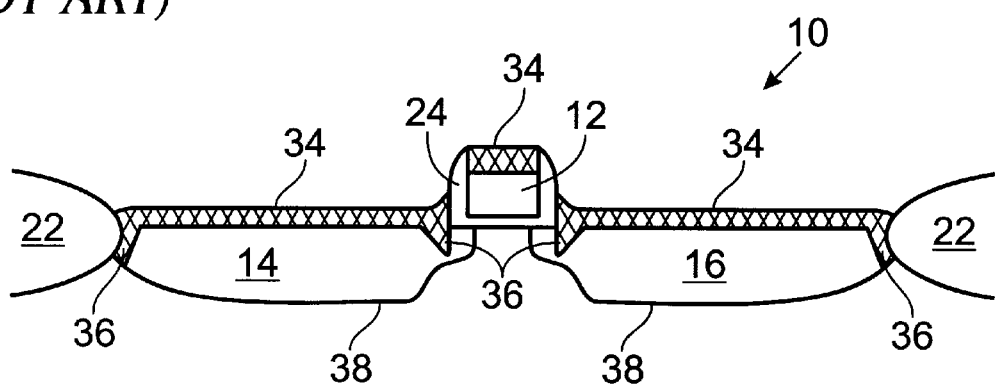

FIG. 5 is a partial cross-sectional view of transistor 10 of FIG. 5 showing perturbations, or intrusions 36 of silicide formed in the silicon of source/drain 14/16 after annealing (prior art). Severe perturbations extending through source/drain junction areas 38 are sometimes called junction spikes (not shown). Perturbations 36 potentially occur at any boundary region between source/drain 14/16 and a neighboring oxide region (22 and 24). After the silicidation process, unreacted metal 32 overlying oxide regions 22 and 24 is removed. Source/drain regions 14/16 undergo another step of dopant ion implantation, either before or after silicidation, to form source/drain junction areas 38 with a junction depth 40 (as defined in FIG. 3). Silicide incursions 36 disrupt the intended electrical fields, resulting in leakage current. Alternately, to prevent leakage current, junction depth 40 (FIG. 3) must be increased.

FIGS. 6–16 are steps in the fabrication of a completed MOS transistor made in accordance to the present invention, having shallow source/drain junctions with low leakage current. Typically, a transistor 50, similar to transistor 10 of FIG. 1, is formed by isolating a well of silicon with a local oxidation of silicon (LOCOS) or shallow trench isolation (STI) techniques. Then, the well is doped through ion implantation. Oxide is deposited for the gate oxide layer. Polysilicon is deposited, often through chemical vapor deposition (CVD), doped, and etched to form a gate electrode. The silicon well is given a low density doping (LDD), and gate sidewalls are formed.

Figure 6:
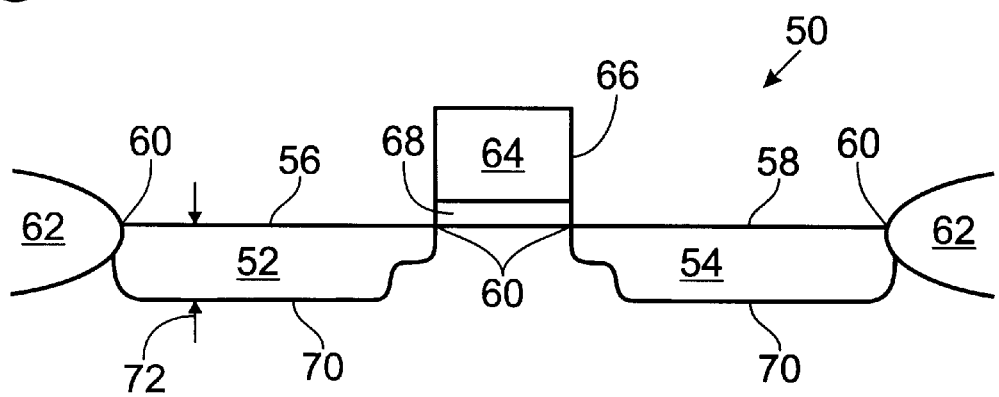
FIGS. 6–16 illustrate steps in the formation of a completed MOS transistor having shallow source/drain junctions with low leakage currents.

FIG. 6 is a partially cross-sectional view of transistor 50. Transistor 50 comprises silicon source/drain regions 52/54 having horizontal top surfaces 56 and 58, respectively, and edges 60 around the perimeter of top surfaces 56/58. Field oxide regions 62 have boundaries adjacent at least part of top surface edges 60. Typically, source/drain regions 52/54 are bounded a three sides by field oxide 62, see FIG. 1 plan view. A gate electrode 64 having vertical sidewalls 66 is adjacent source/drain top surface edges 60 on the fourth side (see FIG. 1). Gate electrode 64 overlies a gate oxide layer 68. Source/drain 52/54 also have junction areas with metallurgical edges 70 at a predetermined junction depth 72 from source/drain top surfaces 56/58. Junction depth 72 is in the range between 300 and 2000 Å.

Figure 7:
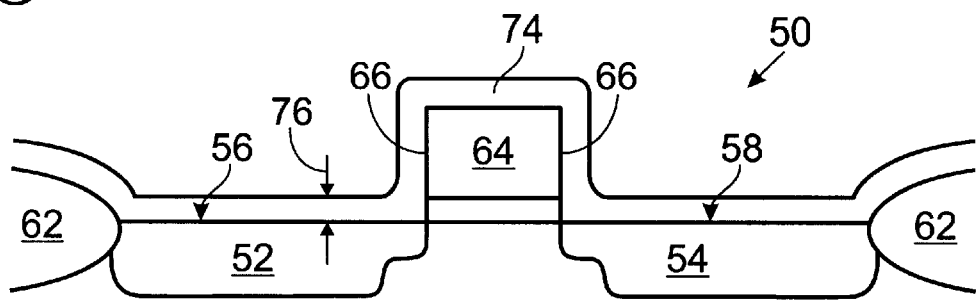

FIG. 7 is a partial cross-sectional view of transistor 50 of FIG. 6 following the deposition, often isotropically, of a layer of oxide 74, having a predetermined oxide layer thickness 76, over gate electrode 64, field oxide region 62, and source/drain regions 52/54. Oxide layer thickness 76 is in the range between 100 and 350 Å. The oxide is deposited through CVD, oxidation, or thermal oxidation techniques. As will become evident below, there is a strong correlation between oxide thickness 76 and the first gap depth.

Figure 8:
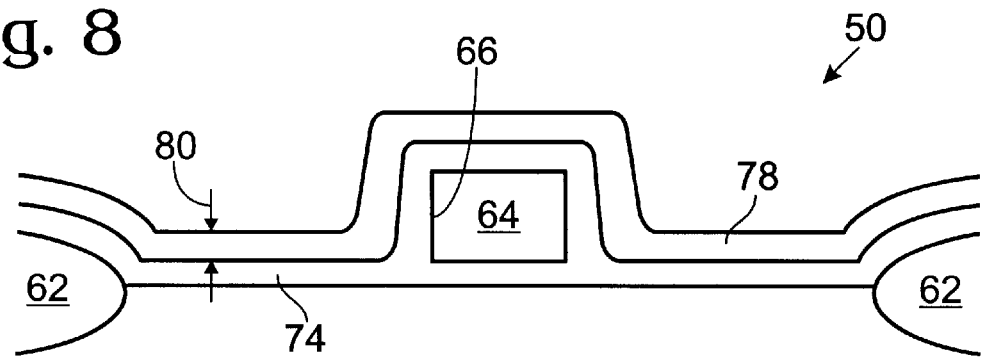

FIG. 8 is a partial cross-sectional view of transistor 50 of FIG. 7 following a deposition of a layer of nitride 78 overlying oxide layer 74. Nitride layer 78 has a predetermined thickness 80 in the range between 300 and 1000 Å. Both oxide 74 and nitride 78 layers overlie the insulating field oxide 62, top surfaces 56/58, and gate electrode 64, including vertical sidewalls 66. There is a strong correlation between nitride thickness 80, oxide thickness 76, and the first gap width (presented below).

Figure 9:
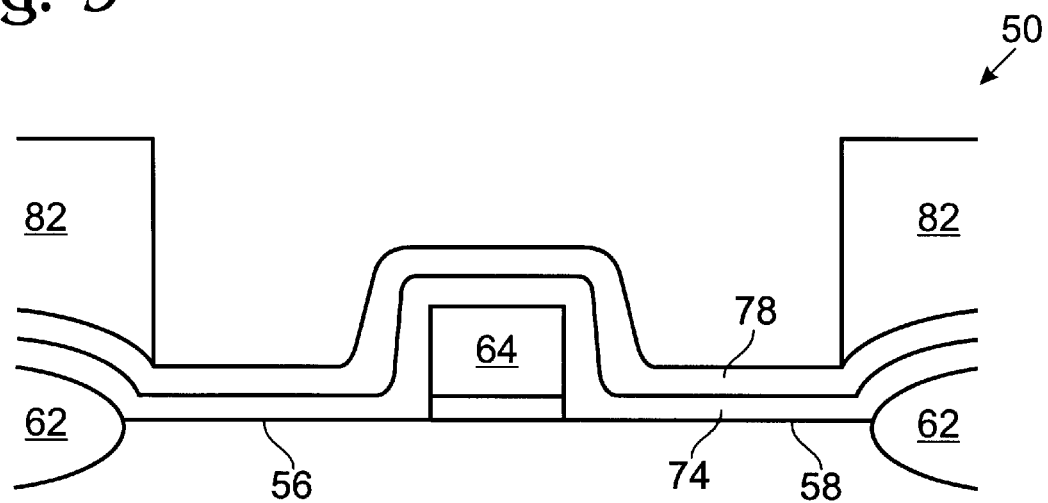

FIG. 9 is a partial cross-sectional view of transistor 50 of FIG. 8 illustrating the masking of field oxide regions 62. That is, nitride layer 78 overlying field oxide region 62 is masked. A layer of photoresist 82 is deposited and selectively removed through conventional process techniques.

Figure 10:
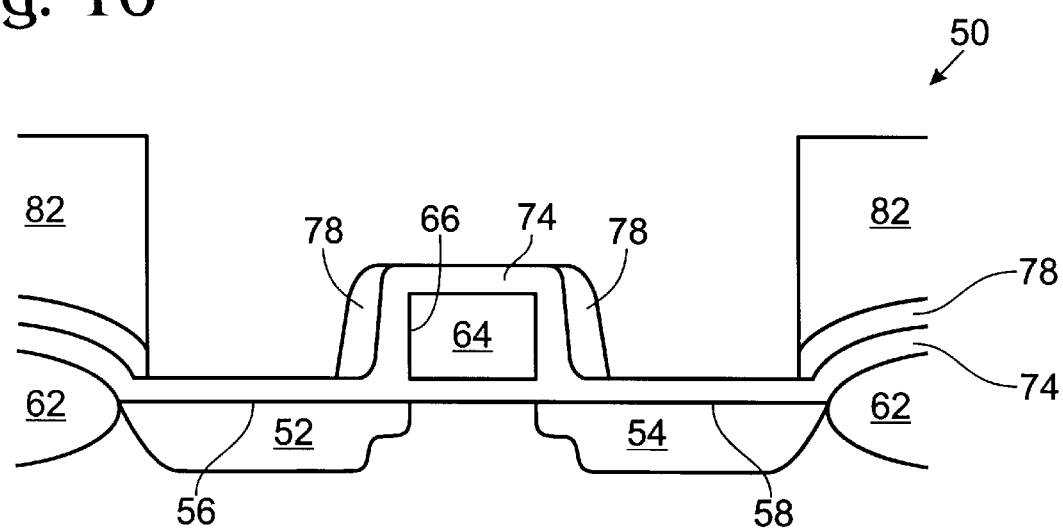

FIG. 10 is a partial cross-sectional view of transistor 50 of FIG. 9 following an anisotropic etching of nitride layer 78. Nitride overhang structures on gate electrode 64 are begun by anisotropically etching, in the vertical direction, nitride layer 78, to remove nitride 78 overlying source/drain horizontal top surfaces 56/58, and to expose oxide layer 74. Nitride 78 overlying gate electrode vertical surfaces 66 is not etched.

Figure 11:
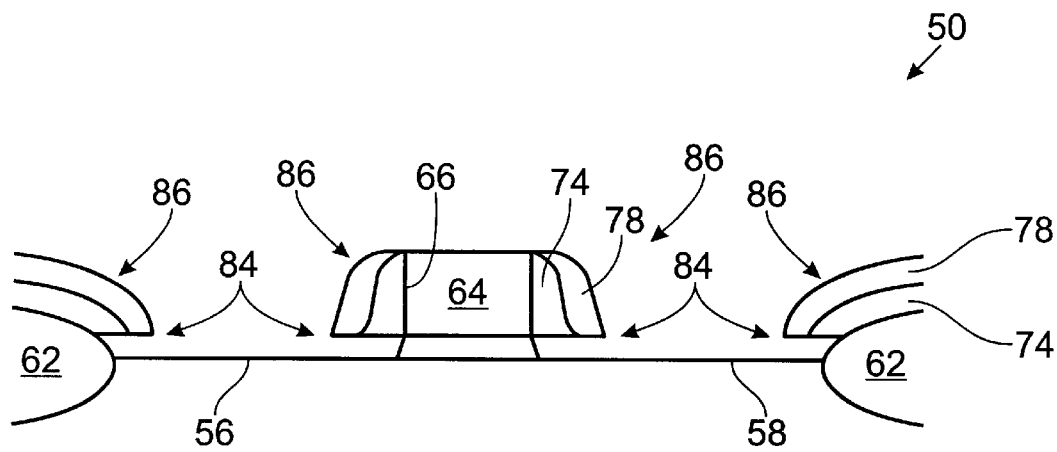

FIG. 11 is a partial cross-sectional view of transistor 50 of FIG. 10 illustrating the removal of exposed oxide layer 74. First, photoresist field oxide mask 82 is etched, to remove it. Then, an isotropic etch is performed, with an etchant having a higher oxide to nitride etch selectivity, of exposed oxide layer 74. A first gap 84 is formed between nitride overhang structures 86 and source/drain top surfaces 56/58. Temporary nitride overhang structures 86 overlie gate electrode vertical sidewalls 66 and field oxide boundaries 62, adjoining source/drain top surfaces 56/58.

Figure 12:
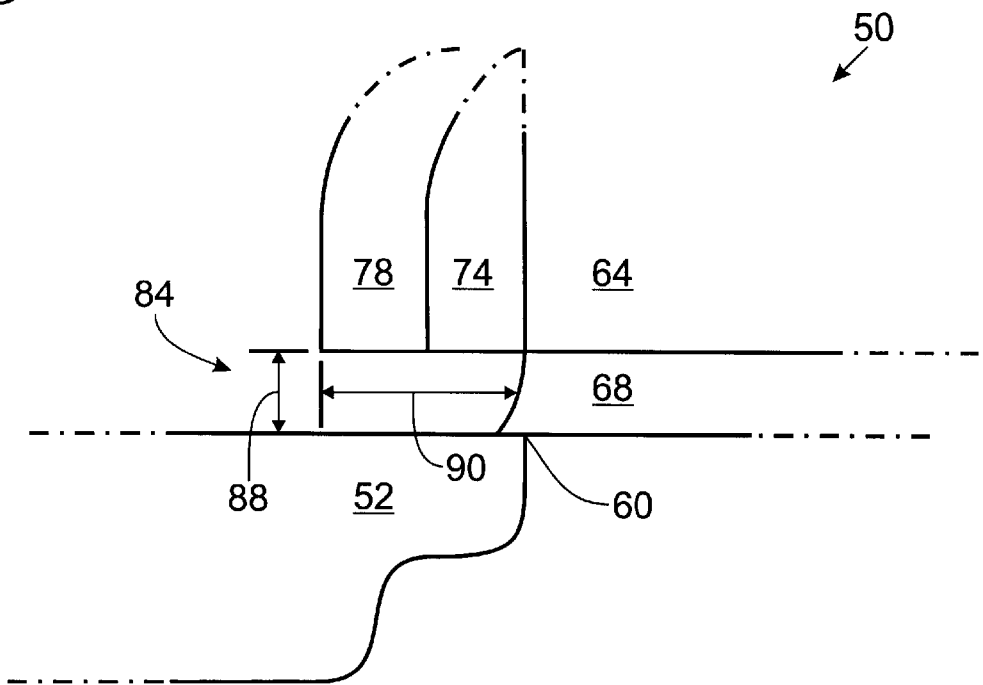

FIG. 12 is a partial cross-sectional view of transistor 50 of FIG. 11, with an expanded view of first gap 84. First gap 84 has a predetermined first vertical gap depth 88 in the range between 100 and 350 Å, and a predetermined first horizontal gap width 90 in the range between 150 and 500 Å. In some aspects of the invention, gap width 90 is wide enough to expose top surface edge 60 adjoining gate electrode 64. Alternately, gap width 90 is small enough so that edge 60 is not exposed. Although only first gap 84 associated with source 52 is depicted in FIG. 12, the other first gaps 84 shown in FIG. 10 have substantially the same dimensions.

Figure 13:
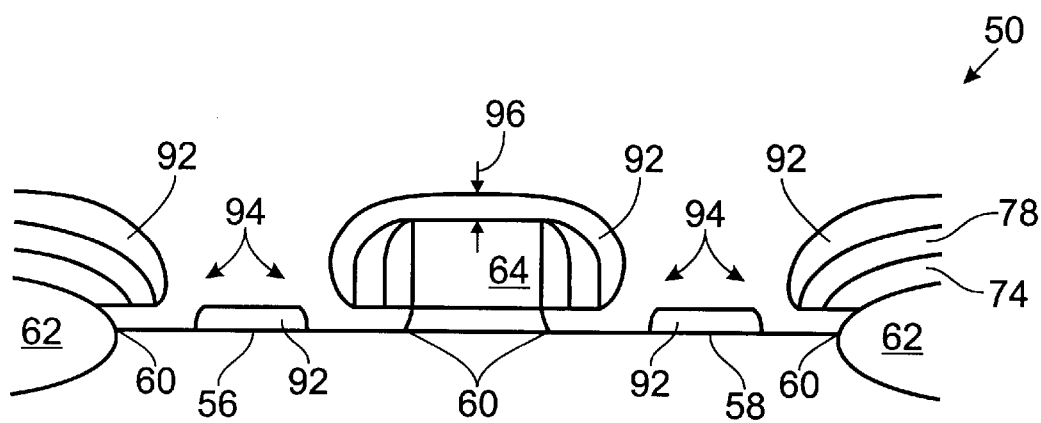

FIG. 13 is a partial cross-sectional view of transistor 50 of FIG. 11 illustrating the deposition of a silicidation metal 92. Silicide metal 92 is selected from the group consisting of Co, Ni, Ti, Mo, Ta, W, Cr, Pt, and Pd. Metal 92 is deposited overlying source/drain top surfaces 56/58 and nitride overhang structures 86, thin enough to form a second gap 94 isolating metal 92 overlying overhang structures 86 from metal 92 overlying source/drain top surfaces 56/58. As a result, top surfaces edges 60 are not covered by metal 92. Metal layer 92 has a predetermined thickness 96 in the range between 50 and 300 Å.

Figure 14:
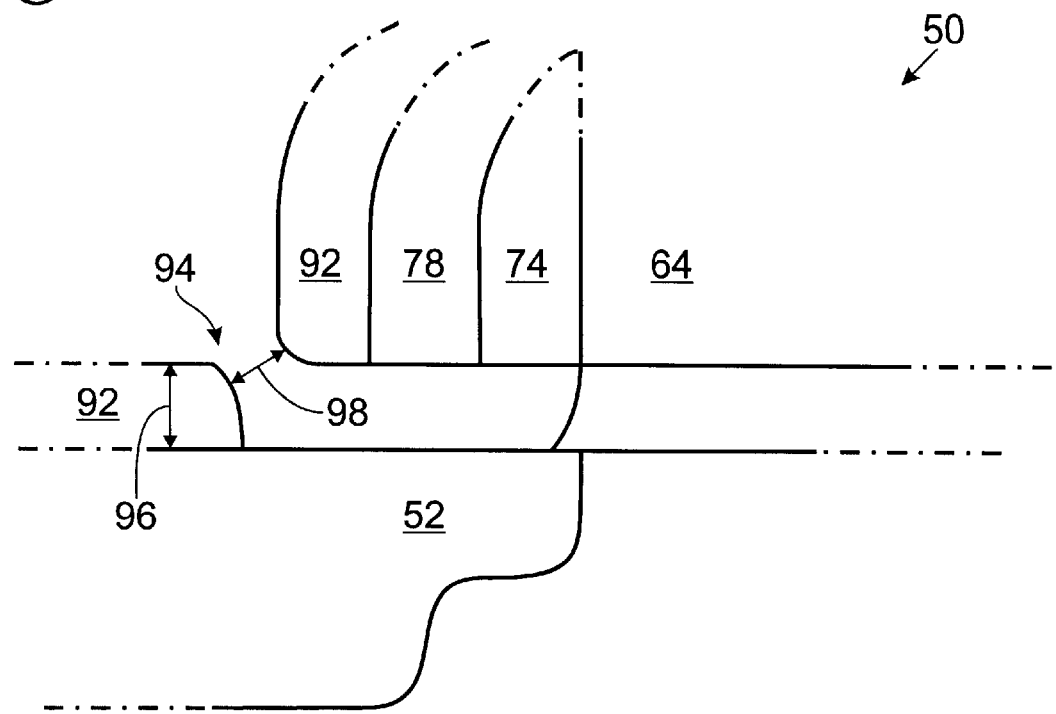

FIG. 14 is a partial cross sectional view of transistor 50 of FIG. 13, showing an expanded view of second gap 94. Second gap width 92 has a predetermined second gap width 98 in the range between 20 and 100 Å.

Figure 15:
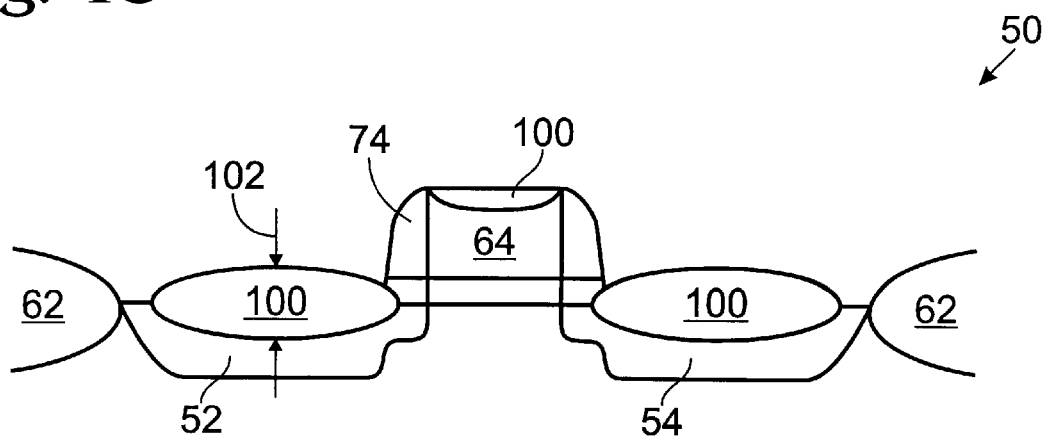

FIG. 15 is a partial cross-sectional view of transistor 50 of FIG. 13 after annealing. When Co is silicidation metal 92, the predetermined first temperature is in the range between 550 and 800 degrees C., and the first time duration is in the range between 20 and 60 seconds. When Ni is silicidation metal 92, the first temperature is approximately 450 degrees C., and the first time duration is in the range between 20 and 30 seconds. Low resistance silicide layers 100 overlie source/drain top surfaces 56/58. Silicide layer 100 has a predetermined nominal silicide layer thickness 102. Nominal silicide layer thickness 102 is in the range between 100 and 500 Å. In FIG. 15, unreacted metal 92 on nitride layer 78 has been removed. Typically, silicide layer 100 is also formed overlying electrode 64. It is also typical to remove nitride layer 78 in subsequent fabrication steps.

Figure 16:
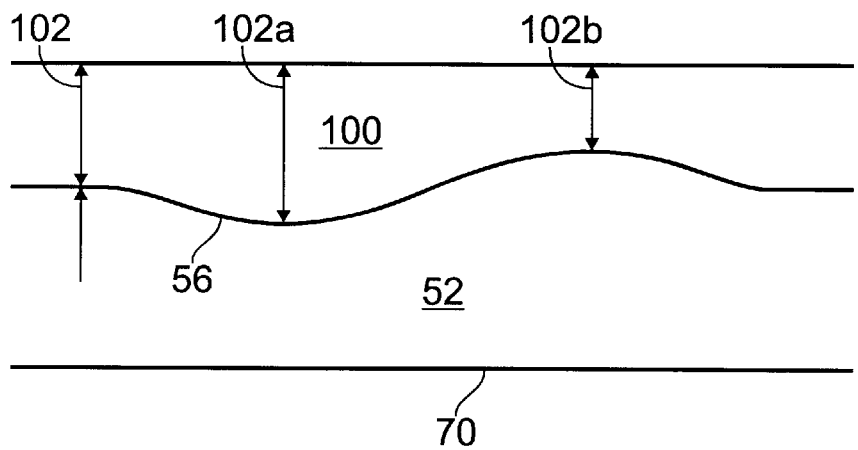

FIG. 16 is a partial cross-sectional view of transistor 50 of FIG. 15, showing an expanded view of source 52. Silicide layer 100 is shown with a nominal thickness 102, which is defined as the sum of maximum thickness 102a and minimum thickness 102b, divided by 2. Silicide layer 100 has a predetermined silicide thickness tolerance that is less than 50% of nominal silicide layer thickness 102. The tolerance is determined by taking the difference between maximum thickness 102a and minimum thickness 102b, and dividing by 2. The spacing between the junction area, with metallurgical edges 70, is maximized by preventing silicide 100 perturbations on silicon top surfaces 56/58.

The edges of silicided junctions are a major source of leakage in very shallow junction devices with cobalt silicide. The leakage is not correlated proportionally with the area of the junction, but primary dominated by the length of the edge. This edge leakage is reduced by using the overhang structure demonstrated in FIGS. 6–16.

Figure 17:
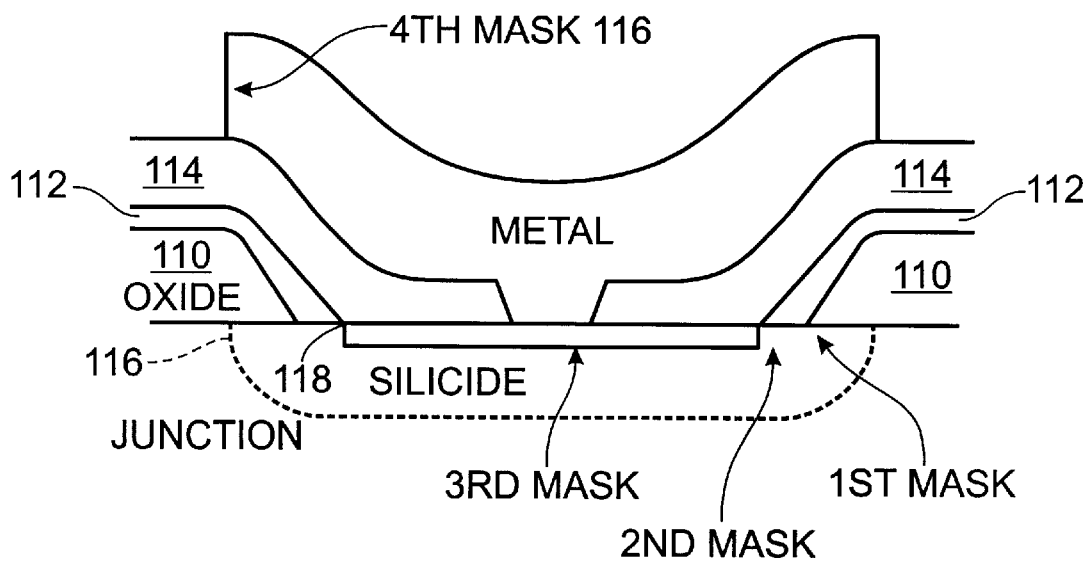
FIG. 17 is a schematic cross-sectional view of the masks used to prepare an overhang structure in junction diodes using six-inch (100) prime silicon wafers.

Junction leakage was identified by using an additional salicide mask to separate the salicide edge from the junction edge. The edge effect was confirmed by using an overhang structure which cuts off the extra supply of metal from the surrounding field oxide during silicide reaction. FIG. 17 is a schematic cross-sectional view of the masks used to prepare an overhang structure in junction diodes using six-inch (100) prime silicon wafers. A total of four mask levels were used to prepare the junction diodes, they are: $P^+$ or $N^+$ implantation mask 110; salicide mask 112; contact mask 114; and metal mask 116. Extra salicide mask (second mask) 112 was used to separate the junction edge 116 from salicide edge 118. Salicide edge 118 is approximately 2 μm away from junction edge 116.

The p-type or n-type wells were formed by 50 keV boron and 120 keV phosphorus implantation with a dose of $8\times10^{12}$ $cm^{-2}$, respectively. A 300 Å thick thermal oxide was formed and followed by a 4000 Å thick silane oxide deposition and a 2 hrs. diffusion anneal at 1000° C. for 2 hrs. The active areas were defined by first implantation mask 110. After the active areas were opened by a buffered oxide etch (BOE) wet etch or a plasma etch, the P+or N+regions were implanted with $BF_2$ or arsenic with various energies to a dose of $4 \times 10^{15}$ cm$^{-2}$, respectively. A 2000 Å thick silane oxide was then deposited. The junctions were formed by an activation anneal at 850° C. for 30 min. The salicide areas were then defined by second mask (salicide mask) 112. A single layer cobalt or a bi-layer Ti/Co film was deposited in an e-beam evaporation system after the salicide areas were opened by a plasma etch. The salicide process was performed using a one-step anneal followed by a hot sulfuric acid/peroxide solution etch (piranha etch) to remove the unreacted metal film. In some cases, a two-step salicide process was used by adding a second anneal after the piranha etch. A 4000 Å thick silane oxide was then deposited. Contact holes were defined by third mask 114. Plasma etch was performed to open contact holes. Metal film (Ti/TiN/AlCu) was deposited and patterned using fourth mask 116 by metal plasma etch, and forming gas annealing.

A few extra steps were required to create an overhang structure. Prior to applying salicide mask 112, a 2000 Å thick PECVD nitride was deposited. After the salicide areas were defined, the nitride was etched in a plasma etching tool and then the 2000 Å silane oxide was wet etched in BOE solution. The overhang structure was created due to the undercut of the oxide by the wet etch.

Figure 18A:
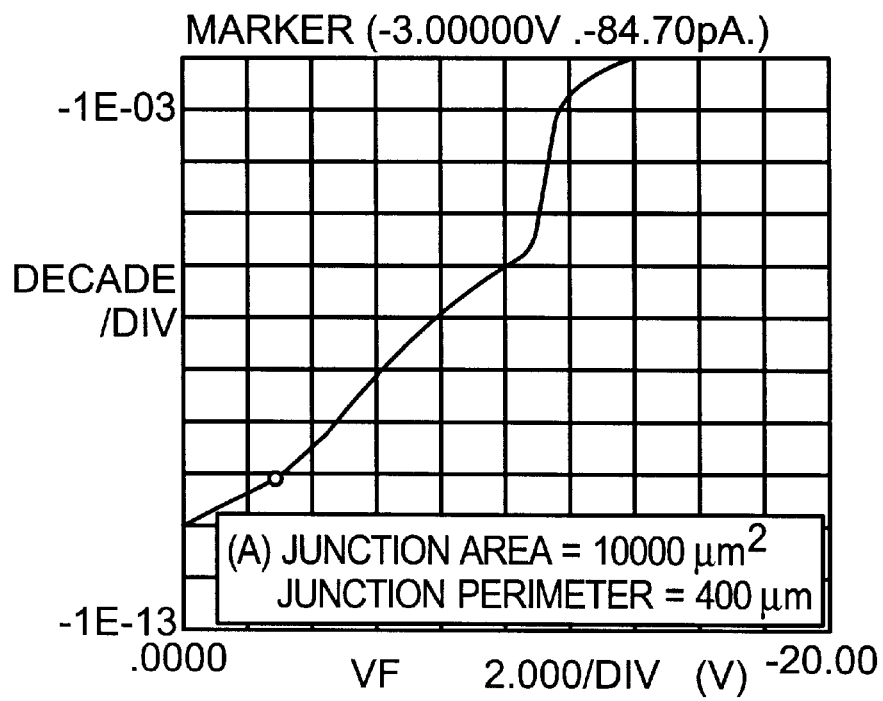
FIGS. 18*a* and 18*b* are graphs illustrating the electrical characteristics of devices without an overhang structure.
Figure 18B:
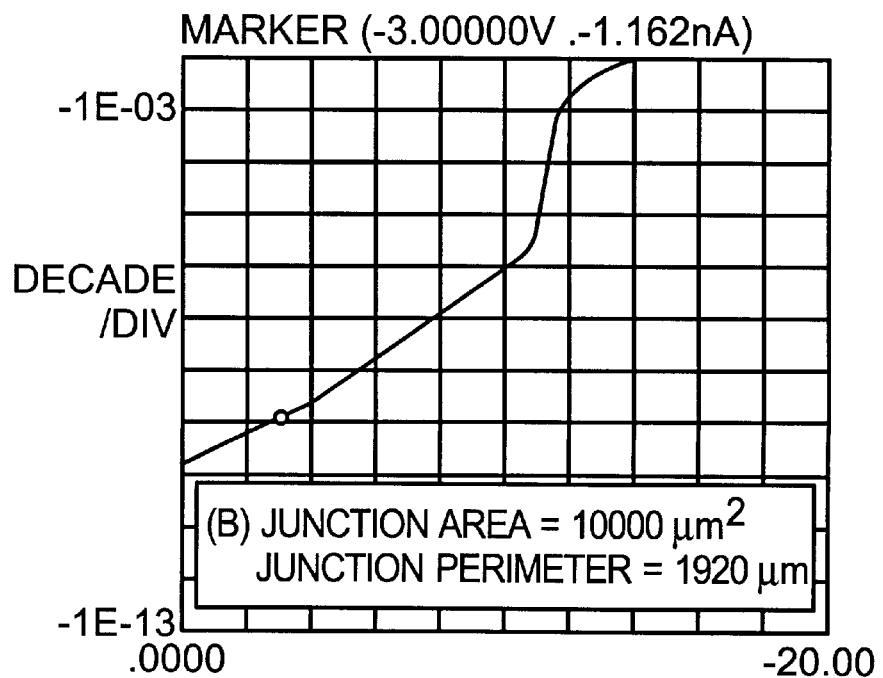

FIGS. 18a and 18b are graphs illustrating the electrical characteristics of devices without an overhang structure. The I-V characteristic curves were measured using a HP 4145B semiconductor parameter analyzer. The dimension of the junction area was 100×100 μm. The junction depth was estimated by a SIMS depth profile. The sheet resistance was measured using a Prometrix four point probe.

The P⁺/N junctions were formed by implanting 60 keV $BF_2$ at a dose of $4 \times 10^{15}$ cm$^{-2}$ and followed by an activation anneal at 850° C. for 30 min. Cobalt salicides were formed using a two-step anneal (650° C./30 s+850° C./30 sec) after the junction formation. A Ti/Co bi-layer salicide process was started with 20 Å thick titanium and 140 Å thick cobalt films. The junction depth was about 2300 Å as determined by SIMS depth profile. The silicide thickness was about 460 Å as estimated by sheet resistance.

The I-V characteristics were measured on two types of test structures; one was a rectangular structure with a 400 μm perimeter, another was a serpentine structure with a longer 1920 μm perimeter. The junction area for both structures was 10,000 μm². The reverse I-V curves from the rectangular structure and the serpentine structure are shown in FIGS. 18a and 18b, respectively. These junctions exhibited a high leakage current with strong edge effect. The leakage current from the serpentine structure was more than one order of magnitude higher than that from the rectangular structure. This results were also observed from devices formed from single layer cobalt and Ti/Co bi-layer with silicide thickness ranging from 300 to 600 Å with implantation energy varied from 20 to 70 keV both $BF_2$ and arsenic implantation.

Since leakage current is not dependent on junction area, and junction leakage is greater with devices having a higher edge to area ratio, it is concluded that the main source of leakage is the edge of the salicide area, not the junction area. A possible junction leakage mechanism is shown in FIGS. 1–5. During the salicide step, there is still abundant metal supply from the field oxide region after the completion of silicidation in the area of silicon. The silicidation proceeds downward along the edge of field oxide due to the extra supply of metal. Severe junction leakage may occur even if the silicide does not penetrate through the junction.

Figure 19A:
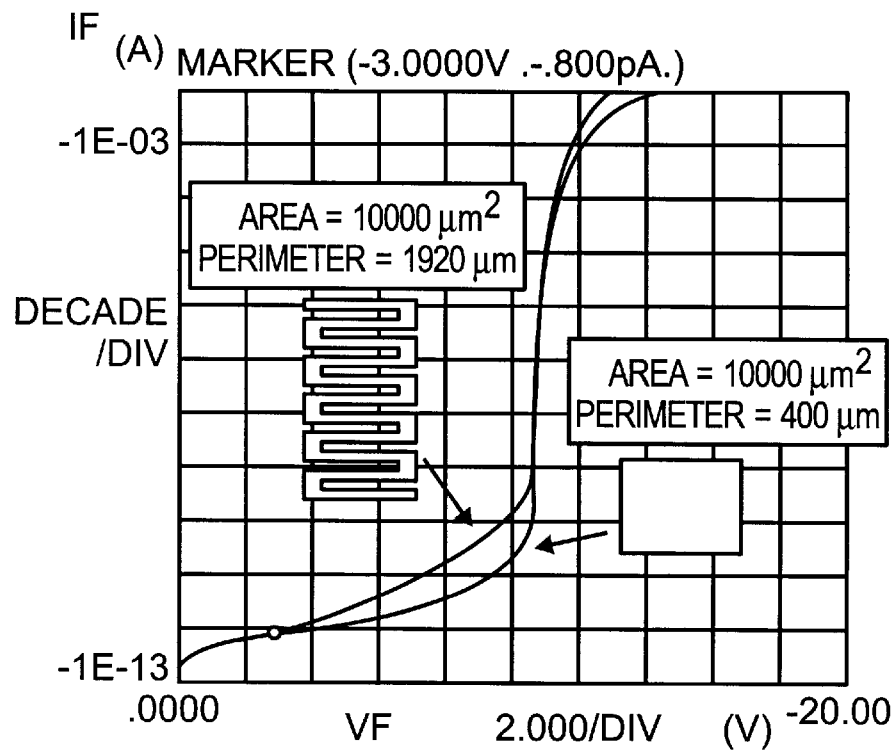
FIGS. 19*a* and 19*b* are graphs comparing electrical characteristics of a device with silicide and an overhang structure, and a device without silicide.
Figure 19B:
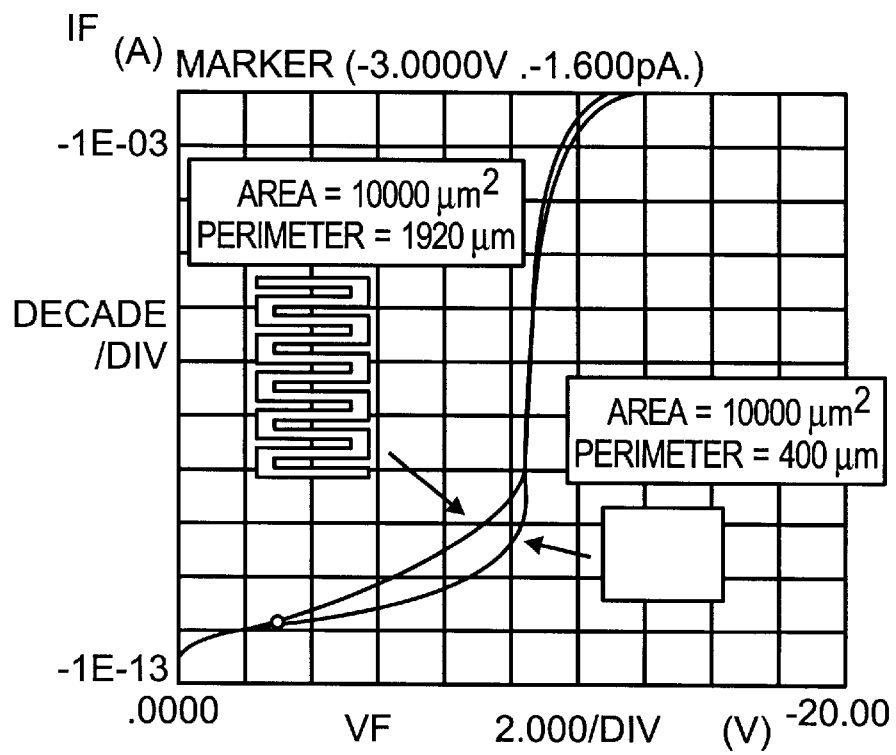

In order to confirm this model, an overhang structure was used to stop the extra supply of the metal during the salicidation process. Wafers prepared with the overhang structure showed a significant reduction of leakage current. FIGS. 19a and 19b are graphs comparing electrical characteristics of a device with silicide and an overhang structure, and a device without silicide. Two pairs of P⁺/N junction reverse I-V curves are displayed. The implantation energy of $BF_2$ was 30 keV. FIG. 19a was from a control wafer went through same processes without the salicidation steps. The salicidation process was performed by depositing a 8 nm thick cobalt film followed by a one-step anneal process at 650° C. for 30 sec. Leakage measurements from salicided wafer with overhang structure (FIG. 19b) showed similar result to those of the control wafer. In addition, the leakage from the serpentine structure was not any higher than the leakage from the rectangular test structure.

The leakage in cobalt salicided junctions is mostly due to a edge effect occurring during salicidation. This effect is confirmed by the complete elimination of edge effect consequences with the use of an overhang structure. Leakage current lower than 10 nA/cm² for P+/N junctions with junction depth less than 1500 Å was reproducibly achieved by this method. The sheet resistance was about 5 ohm/sq.

FIG. 20 is a flow chart illustrating a method for forming shallow source/drain junctions with low leakage currents. Step 200 provides a MOS transistor. Step 202 forms source/drain regions, having a horizontal top surface and edges around the perimeter of the top surface bounded by field oxide regions in a silicon well. A gate electrode is also formed with vertical sidewalls adjacent the top surface. Step 204 selectively forms insulating overhang structures, from material such as nitride, on the field region adjoining the source/drain top surfaces and the vertical sidewalls of the gate electrode. A gap is created between the nitride structures and the edges of the top surfaces, whereby the perimeter of the top surfaces is located in the gap. In some aspects of the invention, the gap width is deep enough to expose the source/drain top surface edges adjoining the gate electrode (edge 78 in FIG. 8).

Step 206 deposits metal overlying the top surfaces, gate electrode, and field oxide in a thin enough layer so as to form gaps between the nitride structures and the source/drain top surfaces. That is, the metal overlying the top surfaces is isolated from the metal overlying the field oxide and the gate electrode. The metal is selected from the group consisting of Co, Ni, Ti, Mo, Ta, W, Cr, Pt, and Pd, although Ni, and especially Co is preferred. The metal has a predetermined metal thickness in the range between 50 and 300 Å. Step 208 anneals the metal at a first temperature and first time duration, forming a layer of low resistance silicide compound having a predetermined nominal silicide layer thickness and a predetermined silicide thickness. Low resistance sulicide is usually a metal-disilicide product, such as $CoSi_2$. However, for some metals, such as Ni, the mono-silicide compound has a lower resistance than the disilicide. Step 210 is a product, a MOS transistor where silicide is evenly formed on the source/drain top surfaces.

Step 204 includes forming nitride overhang structures having a first predetermined horizontal gap width and a first predetermined vertical gap depth between the nitride overlying the vertical sidewalls and field oxide, and the source/drain top surfaces. The first gap depth being is in the range between 100 and 350 Å, and the first gap width is in the range between 150 and 500 Å. Then, Step 206 includes forming a second gap having a second predetermined gap width between the metal overlying the vertical sidewalls and field oxide, and the source drain top surfaces. The second gap width is in the range between 20 and 100 Å.

Some aspects of the invention include the following steps, following Step 202, and preceding Step 204. Step 202*a* deposits a thin layer of oxide having a predetermined oxide layer thickness overlying the gate electrode, source/drain regions, and field oxide regions. The oxide layer thickness is in the range between 100 and 350 Å. Typically a CVD, oxidation, or thermal oxidation process is used to isotropically deposit oxide evenly on all exposed surfaces.

Step 202*b* deposits a nitride layer having a predetermined nitride layer thickness overlying the oxide layer deposited in Step 202*a*. Step 202*b* includes the nitride layer thickness being in the range between 300 and 1000 Å. Step 202*c* forms a photoresist mask selectively overlying the field oxide regions, exposing the nitride layer overlying the source/drain top surfaces and gate electrode. In this manner, the field oxide is protected. Step 202*d* anisotropically etches, in the vertical direction, the nitride layer, removing the nitride layer overlying the source/drain top surface and exposing the oxide layer deposited in Step 202*a*, but not etching the nitride overlying the vertical sidewalls of the gate electrode. Typically, the etching includes a plasma or dry etch using $SF_6$, $NF_3$, and other fluorine gases. Step 202*e* etches to remove the photoresist overlying the field oxide region. Then, Step 204 includes isotropically etching with an etchant, having a higher oxide to nitride etch selectivity, removing the oxide layer overlying the source/drain regions, to form the nitride overhang structures.

When Step 206 includes using Co as the silicidation metal, Step 208 includes the first temperature being in the range between 550 and 800 degrees C., and the first time duration being in the range between 20 and 60 seconds. When Step 206 includes using Ni as the silicidation metal, Step 208 includes the first temperature being approximately 450 degrees C., and the first time duration being in the range between 20 and 30 seconds. The silicide layer nominal thickness formed is in the range between 100 and 500 Å, and the silicide thickness tolerance is less than 50% of the nominal silicide thickness tolerance (as defined in the discussion of FIG. 16).

The source/drain junction areas are formed either before or after the silicidation process of Steps 206–208. In one aspect of the invention, a further step follows Step 202, and precedes Step 202*a*. Step 204*f* (not shown) implants the source/drain regions with dopant and anneals, forming source/drain junction areas with metallurgical edges at a predetermined junction depth, respectively, from the source/drain top surfaces. The prevention of silicide formation at the source/drain edges maximizes the spacing between the silicide layer and the metallurgical edges. Step 202*f* includes the unction depth being in the range between 300 and 2000 Å.

Alternately, a further step follows Step 208. Step 208*a* (not shown) implants the source/drain regions with dopant and anneals, forming source/drain junction areas with metallurgical edges at a predetermined unction depth (300–2000 Å), respectively, from the source/drain top surfaces.

A transistor, and process method for making an overhang structure to prevent the silicide edge effect is present herein. The silicide edges of the source and drain are thought to create leakage currents in transistors having shallow source/drain junction areas. The overhang structure prevents the deposition of silicidation metal on the gate electrode sidewall region near source/drain edge, and on the field oxide adjacent the source/drain. Since metal is not present at the edge, the silicide layer remains uniformly flat, with no edge growths into the junction areas. The above-mentioned techniques work with $P^+/N$ as well as $N^+/P$ junctions. Further, the method of fabricating the overhang is not limited to specific insulation material. Oxide and nitride have been described because of their ease of use and etch selectivity, but other materials may also be used. Typically, the overhang structure is temporary, being removed from the sidewalls of the gate electrode after the silicidation process is complete. Other embodiments and variations of the invention will occur to those skilled in the art.

what is claimed is:

1. In a MOS transistor, a method for forming shallow source/drain junctions with low leakage currents, comprising the steps of:

a) forming source/drain regions, having a horizontal top surface and edges around the perimeter of the top surface bounded by field oxide regions in a silicon well, and forming a gate electrode with vertical sidewalls adjacent the top surface;

b) selectively forming nitride structures on the field region adjoining the source/drain top surfaces and the vertical sidewalls of the gate electrode, creating a gap between nitride structures and the edges of the top surfaces, whereby the perimeter of the top surfaces is located in the gap;

c) depositing metal overlying the top surfaces, gate electrode, and field oxide in a thin enough layer so as to form gaps between the nitride structures and the source/drain top surfaces, isolating the metal overlying the top surfaces from the metal overlying the field oxide and the gate electrode; and d) annealing the metal at a first temperature and first time duration, forming a layer of low resistance silicide compound having a predetermined nominal silicide layer thickness and a predetermined silicide thickness tolerance, whereby silicide is evenly formed on the source/drain top surfaces.

2. A method as in claim 1 in which Step b) includes forming a nitride overhang structures having a first predetermined horizontal gap width and a first predetermined vertical gap depth between the nitride overlying the vertical sidewalls and field oxide, and the source/drain top surfaces; and in which Step c) includes forming a second gap having a second predetermined gap width between the metal overlying the vertical sidewalls and field oxide, and the source drain top surfaces.

3. A method as in claim 2 comprising the following steps, after Step a), and before Step b), of:

$a_1$) depositing a thin layer of oxide having a predetermined oxide layer thickness overlying the gate electrode, source/drain regions, and field oxide regions;

$a_2$) depositing a nitride layer having a predetermined nitride layer thickness overlying the oxide layer deposited in Step $a_1$);

$a_3$) forming a photoresist mask selectively overlying the field oxide regions, exposing the nitride layer overlying the source/drain top surfaces and gate electrode, whereby the field oxide is protected;

$a_4$) anisotropically etching, in the vertical direction, the nitride layer, removing the nitride layer overlying the source/drain top surface and exposing the oxide layer deposited in Step $a_1$), but not etching the nitride overlying the vertical sidewalls of the gate electrode;

$a_5$) etching to remove the photoresist overlying the field oxide region; and in which Step b) includes isotropically etching with an etchant having a higher oxide to nitride etch selectivity, removing the oxide layer overlying the source/drain regions, to form the nitride overhang structures.

4. A method as in claim 3 including the further step, following Step a), and preceding Step $a_1$), of:

$a_6$) implanting the source/drain regions with dopant and annealing, forming source/drain junction areas with metallurgical edges at a predetermined junction depth, respectively, from the source/drain top surfaces, whereby the prevention of silicide formation at the source/drain edges maximizes the spacing between the silicide layer and the metallurgical edges.

5. A method as in claim 4 in which Step $a_6$) includes the junction depth being in the range between 300 and 2000 Å.

6. A method as in claim 3 including the further step, following Step d), of:

e) implanting the source/drain regions with dopant and annealing, forming source/drain junction areas with metallurgical edges at a predetermined junction depth, respectively, from the source/drain top surfaces, whereby the prevention of silicide formation at the source/drain edges maximizes the spacing between the silicide layer and the metallurgical edges.

7. A method as in claim 6 in which Step e) includes forming the junction depth in the range between 300 and 2000 Å.

8. A method as in claim 1 in which Step c) includes a metal selected from the group consisting of Co, Ni, Ti, Mo, Ta, W, Cr, Pt, and Pd.

9. A method as in claim 8 in which Step c) includes using Co as the silicidation metal, and Step d) includes the first temperature being in the range between 550 and 800 degrees C., and the first time duration being in the range between 20 and 60 seconds.

10. A method as in claim 8 in which Step c) includes using Ni as the silicidation metal, and Step d) includes the first temperature being approximately 450 degrees C., and the first time duration being in the range between 20 and 30 seconds.

11. A method as in claim 2 in which Step b) includes the first gap depth being in the range between 100 and 350 Å, and the first gap width being in the range between 150 and 500 Å.

12. A method as in claim 1 in which Step c) includes the metal layer having a predetermined thickness in the range between 50 and 300 Å.

13. A method as in claim 1 in which Step d) includes the silicide layer nominal thickness being in the range between 100 and 500 Å, and the silicide thickness tolerance to be less than 50% of the nominal silicide layer thickness.

14. A method as in claim 3 in which Step $a_1$) includes the oxide layer thickness being in the range between 100 and 350 Å.

15. A method as in claim 3 in which Step $a_2$) includes the nitride layer thickness being in the range between 300 and 1000 Å.

16. A method as in claim 2 in which Step c) includes the second gap width being in the range between 20 and 100 Å.

* * * * *